United States Patent
Hagberg et al.

(10) Patent No.: US 6,952,138 B2
(45) Date of Patent: Oct. 4, 2005

(54) GENERATION OF A PHASE LOCKED LOOP OUTPUT SIGNAL HAVING REDUCED SPURIOUS SPECTRAL COMPONENTS

(75) Inventors: Hans Hagberg, Malmö (SE); Magnus Nilsson, Lund (SE)

(73) Assignee: Telefonaktiebolaget LM Ericsson (publ), Stockholm (SE)

(*) Notice: Subject to any disclaimer, the term of this patent is extended or adjusted under 35 U.S.C. 154(b) by 880 days.

(21) Appl. No.: 09/949,845

(22) Filed: Sep. 12, 2001

(65) Prior Publication Data

US 2003/0050030 A1 Mar. 13, 2003

(51) Int. Cl.$^7$ .......................... H03L 7/085; H03L 7/091
(52) U.S. Cl. .............................. 331/25; 331/1 A; 327/9; 327/12; 327/156; 327/158; 327/159
(58) Field of Search .................... 331/1 A, 8, 10–12, 331/14, 17–18, 25; 327/2–12, 156–159

(56) References Cited

U.S. PATENT DOCUMENTS

| | | | |
|---|---|---|---|
| 4,862,104 A | * | 8/1989 | Muratani et al. ........... 331/1 A |
| 5,781,044 A | | 7/1998 | Riley et al. |
| 5,872,807 A | | 2/1999 | Booth et al. |
| 6,002,273 A | | 12/1999 | Humphreys |
| 6,114,888 A | | 9/2000 | Walley |
| 6,160,456 A | | 12/2000 | Chang |
| 6,219,397 B1 | | 4/2001 | Park |
| 6,240,127 B1 | | 5/2001 | Happonen |

FOREIGN PATENT DOCUMENTS

| | | |
|---|---|---|
| EP | 0940922 A1 | 9/1999 |
| WO | WO99/31807 | 6/1999 |
| WO | WO99/48195 | 9/1999 |

OTHER PUBLICATIONS

Ulrich L. Rohde: "Nonlinear Effects In Oscillators and Synthesizers (Invited)", IEEE MTT–S, May 2001, WEID–1, 8:00 AM, Regular Long, 1045.

* cited by examiner

*Primary Examiner*—David Mis
(74) *Attorney, Agent, or Firm*—Potomac Patent Group, PLLC

(57) ABSTRACT

The present invention helps to mitigate and reduce the amount of interfering signals (e.g. RF leakage) that enter the phase detector of a phase locked loop by acting as a less than perfect sampler. This is accomplished by introducing a time jitter to the signal edges that enter the phase detector input. A phase detector can also be made to act as a less than perfect sampler by intentionally introducing an interfering signal. For example, a small interfering analog signal can be introduced with a different frequency from the reference frequency already present in the PLL. The interfering signal will cause the stable internal signal to vary slightly in time at the rate of the interfering signal frequency. It is this signal variation and jitter introduced on the signal edges entering the phase detector input that induces the phase detector to act as a less than perfect sampler.

26 Claims, 9 Drawing Sheets

GENERATION OF A PHASE LOCKED LOOP OUTPUT SIGNAL HAVING REDUCED SPURIOUS SPECTRAL COMPONENTS

BACKGROUND

The present invention relates to frequency synthesizers and direct modulation, more particularly to phase locked loops, and even more particularly to phase detectors for use in a phase locked loop and exposed to interfering signals placed close to frequencies which are multiples of the reference frequency of the phase locked loop ("PLL").

PLLs are well known and are useful for generating oscillating signals in many types of circuits, including but not limited to radio circuitry. In digital communication systems, for example in mobile telephone communications operating under the Global System for Mobile Communications (GSM) or Digital Communication Systems (DCS) systems, PLLs may be employed to effect continuous phase modulation (CPM) of a carrier signal. One example of such a PLL system is found in U.S. patent application Ser. No. 09/580,632, entitled "Linear Dead-Band-Free Digital Phase Detection," the contents of which are hereby incorporated herein by reference in their entirety.

FIG. 1 is a block diagram of a conventional integer-divide PLL 100. A phase detector 101 compares the phase of a signal supplied by a reference oscillator 103 with the phase of a feedback signal supplied by a frequency divider 105. The output of the phase detector, which represents the phase difference between the two input signals, is filtered by a filter 107. The filtered output is then used to control the frequency of an output signal generated by a voltage controlled oscillator (VCO) 109. The output signal from the VCO 109, in addition to being supplied as an output from the PLL, is also supplied as an input to the frequency divider 105, and is thus the source of the feedback signal. The PLL 100 is governed by the following equations:

$$i_e = K_P\left(\varphi_R - \frac{\varphi_o}{N}\right) \quad (1)$$

$$\varphi_o = i_e Z(s)\frac{K_V}{s},$$

where s, $K_P$, $Z(s)$, and $K_V$ are the complex frequency, phase detector gain, loop-filter trans-impedance, and VCO gain, respectively, and $\phi_R$, $\phi_O$, and $i_e$, are the reference phase (or frequency as $2\pi f = s^*\phi$), the VCO phase, and the phase-detector error current, respectively.

Solving the above equations for $\phi_O$ yields the well-known result that $f_o = N \cdot f_R$, that is, the VCO frequency is an integer multiple of the reference frequency.

Since the loop response time to a change in N (e.g., when a new channel is selected) is proportional to $1/f_R$ (i.e., it takes a certain number of reference cycles to settle) and the minimum channel spacing equals $f_R$, there is a conflict in the choice of reference frequency. That is, it would be desirable to set a low value for $f_R$ to reduce the minimum channel spacing. However, such a setting would result in a larger loop response time, which is undesirable.

To get around the above restriction on channel spacing, fractional-N PLLs have been devised. By employing a variable-modulus divider, rather than an integer divider, it is possible to achieve more flexible divide ratios. For example, performing three successive divisions by 20 followed by one division by 21 results in an average division factor of $(3 \cdot 20 + 21)/4 = 20.25$ and a channel spacing of $f_R/4$. Due to the repetitive nature of this variable modulus division, however, spurious tones will be generated (here at $f_o \pm n \cdot f_R$) that will modulate the VCO.

A transmitter structure called a "Direct Modulation architecture" (transmitter and Local Oscillator synthesizer) is based on the concept of using a Sigma-Delta controlled fractional-N PLL for generating a modulated GSM spectrum at radio-frequency (RF). The output RF signal of the PLL in a highly integrated Direct Modulation architecture has a tendency to leak back to the reference parts of the PLL, such as the phase detector. When this leaking RF signal is mixed with the original wanted baseband signal in the phase detector, a problem arises in that the signal generated at the output of the PLL includes spurious spectral components at N times the reference frequency, where N equals an integer. Furthermore, any PLL exposed to an unwanted RF interferer placed at frequencies close to multiples of the reference frequency will experience problems with spurious spectral components at N times the reference frequency.

Consequently, it is desirable to provide a PLL that will reduce the problem of having N times the reference frequency spurious spectral components around the RF spectrum when using a Sigma-Delta controlled fractional-N PLL as a modulator or frequency synthesizer.

SUMMARY

It should be emphasized that the terms "comprises" and "comprising", when used in this specification, are taken to specify the presence of stated features, integers, steps or components. The use of these terms does not preclude the presence or addition of one or more other features, integers, steps, components or groups thereof.

In accordance with one exemplary embodiment of the present invention, the foregoing and other objects are achieved in a phase locked loop and method comprising a voltage controlled oscillator, a phase detector, and logic that degrades the sampling performance of the phase detector. The logic for degrading the sampling performance can be performed in a plurality of ways. One way is by introducing a controllable delay that supplies a delayed signal to one of the phase detector signal inputs. The logic for degrading also comprises applying an interfering analog signal to an input of the phase detector, wherein the input is associated with a stable internal phase detector signal. Another additional interfering signal having a different frequency from that of the reference frequency of the PLL is applied to the phase detector input that produces a stable internal signal edge. The logic that degrades can also comprise at least two signal inputs of the phase detector and where a controllable delay is placed at both of the two signal inputs. The logic that degrades also comprises at least two signal inputs of the phase detector and where a controllable delay is placed at one of the two signal inputs.

In the present invention, the controllable delay is used to jitter at least one of the internal signal edges within the phase detector. There are different ways of controlling the delay. One way of controlling the delay is to selectively apply one of two delays to an input signal based on a control signal. The controllable delay can be a NO delay and a predefined non-zero delay. Additionally, the controllable delay is selected from a plurality of different delay times. The controllable delay can also be controlled by a digital pseudo random bitstream which is binary for a two level delay setting.

Another controllable delay is controlled by an M-ary digital pseudo random bitstream. The controllable delay can also be controlled by a periodic analog signal. The phase detector comprises at least one component of a Sigma Delta controlled fractional-N phase locked loop.

BRIEF DESCRIPTION OF THE DRAWINGS

The objects and advantages of the invention will be understood by reading the following detailed description in conjunction with the drawings in which.

DETAILED DESCRIPTION

Figure 1:
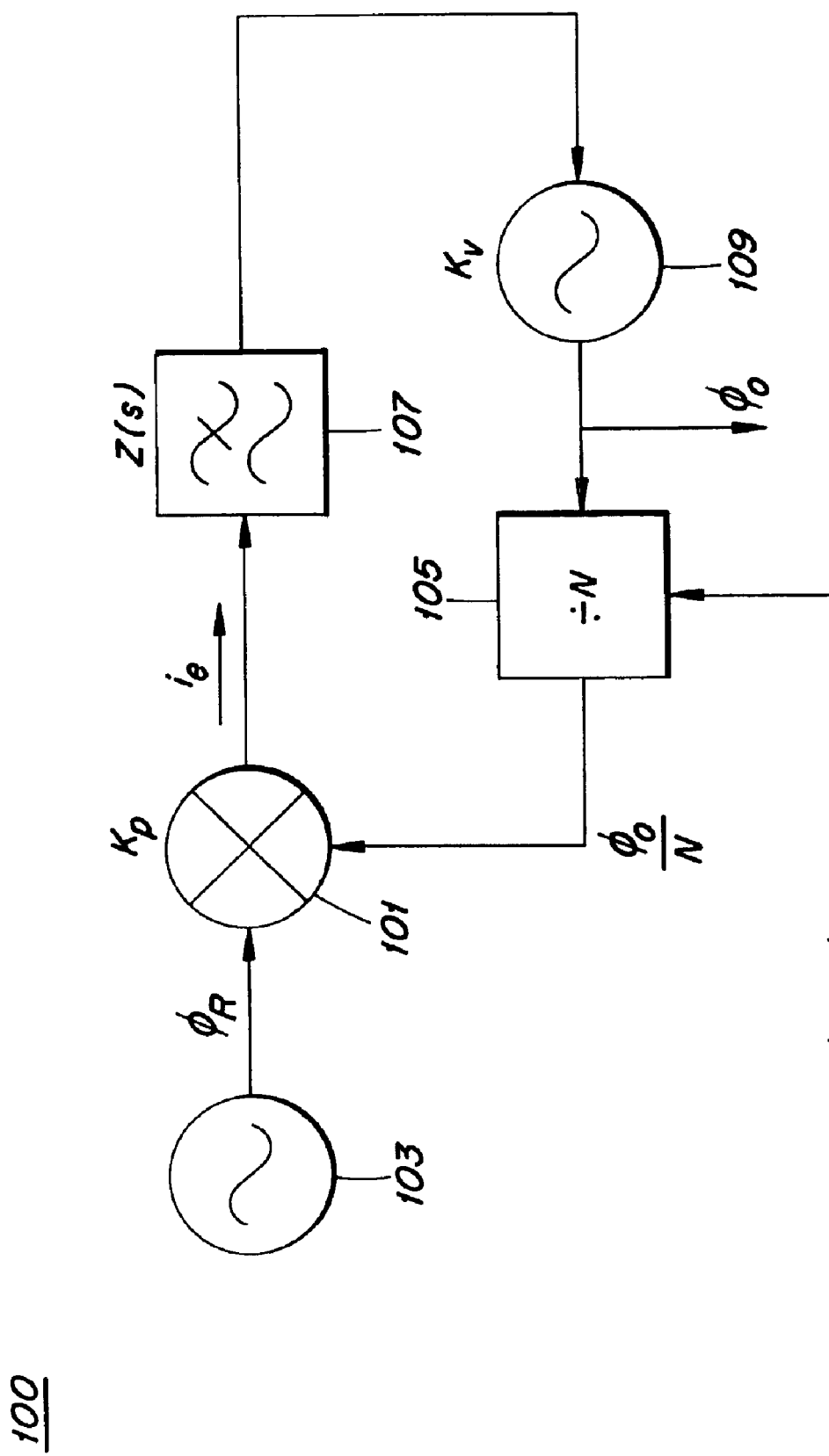
FIG. 1 is a block diagram of an exemplary conventional integer-divide phase-locked loop.

The various features of the invention will now be described with respect to the figures, in which like parts are identified with the same reference characters.

In general, there are three main approaches that can be pursued to address the problem of RF leakage and spurious spectral components in a PLL. First of all, one can minimize the RF signal leaking back to the reference parts of the PLL so that the deleterious effects of the interfering signal are mitigated. Second, one can prevent the leaking RF signal from entering the reference blocks of the PLL. For example, this can be done by positioning an insulating layer or barrier around the reference blocks to insulate them from the leaking RF signal. Third, the phase detector can be made to act as a less perfect sampler by introducing time jitter on the signal edges entering the phase detector input. It is this last approach that the present invention is focused upon implementing in order to address the problems of RF leakage and spurious spectral components in the output signal. The invention can be implemented in any of a number of alternative ways.

In one exemplary embodiment, a phase detector can act as a less than perfect sampler by introducing a time jitter on signal edges that enter the phase detector input. By acting as a less than perfect sampler, the present invention helps to mitigate and reduce the amount of interfering signals (e.g. RF leakage) that enter the phase detector. No additional non-linearities are introduced since all edges of the signals present in the phase detector are intended to be simultaneously time varying.

In another exemplary embodiment, a phase detector can be made to act as a less than perfect sampler by intentionally introducing an interfering signal. For example, a small interfering analog signal can be introduced with a different frequency from the reference frequency already present in the PLL. The interfering signal is applied at an input of the phase detector input that is associated with a stable internal phase detector signal. The interfering signal will cause the stable internal signal to vary slightly in time at the rate of the interfering signal frequency. It is this signal variation and jitter introduced on the signal edges entering the phase detector input that induces the phase detector to act as a less than perfect sampler.

Figure 2:
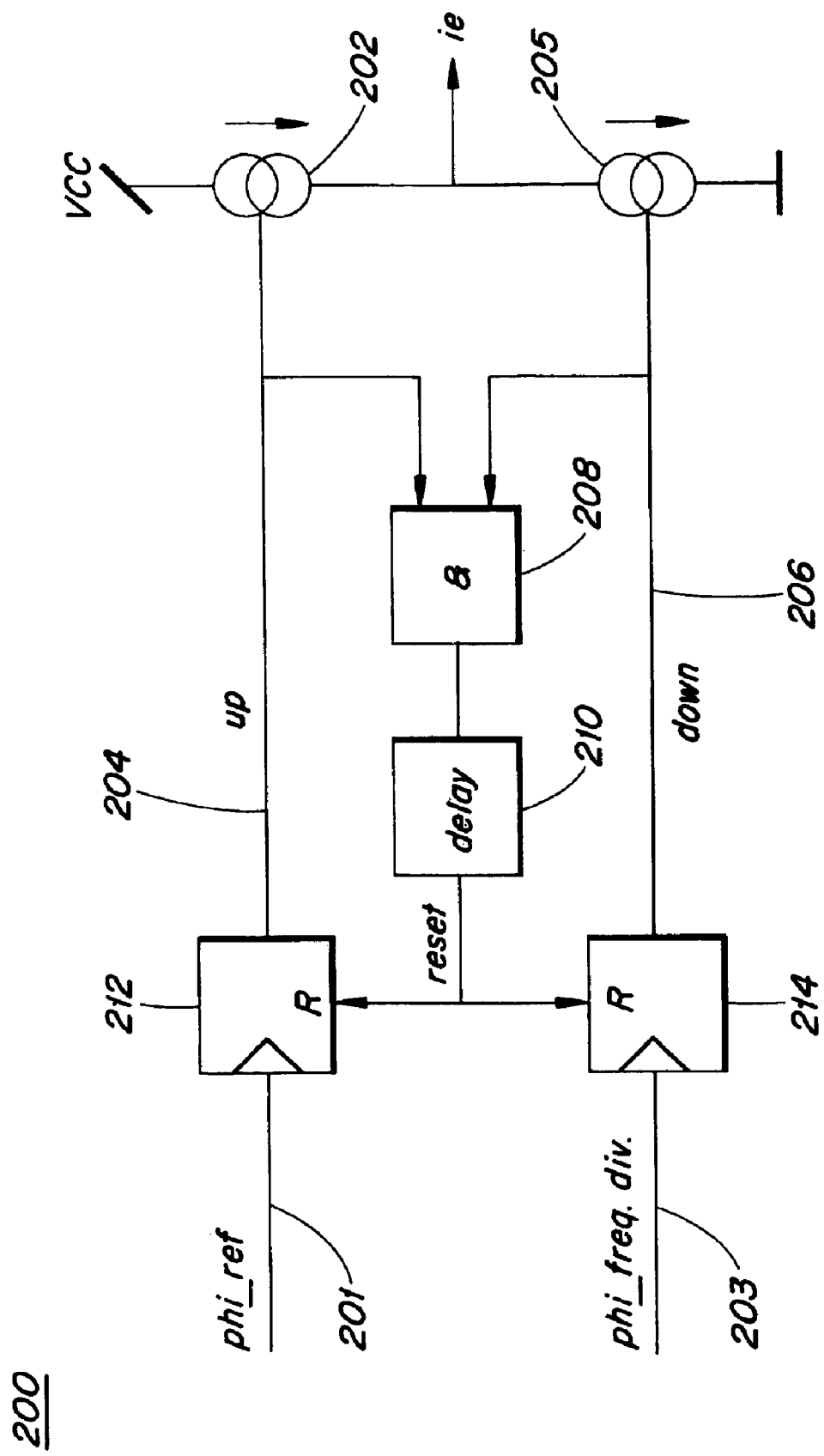
FIG. 2 is an illustration of an exemplary typical dead band free phase/frequency detector.

There are a number of existing PLL topologies for implementing dead band free phase/frequency detectors. FIG. 2 is a block diagram of a digital dead band free phase/frequency detector 200 that may be used in a PLL. The use of first and second digital latches 212, 214 enables multiple states (not shown in FIG. 2) and, hence, an extended operating range of the phase detector 200. In operation, the first latch 212 controls whether a first charge pump 202 is on or off. Similarly, the second latch 214 controls whether the second charge pump 205 is on or off. The first and second charge pumps 202, 205 are connected in series, with the phase detector output current, $i_e$ being related to whether none, one, or both of the first and second charge pumps 202, 205 are turned on. The amount of time that $i_e$ is non-zero is a function of the phase difference between the two input signals, 201 and 203. This is because the first of these signals to present a clocking edge causes the output of the corresponding latch to be asserted, which in turn, causes a corresponding one of the first and second charge pumps 202, 205 to turn on. When the clocking of the remaining input signal is subsequently asserted, it also causes the output of its corresponding latch to be asserted. This causes the other one of the first and second charge pumps 202, 205 to turn on. This state is only temporary, however, because the outputs of both the first and second latches 212, 214 are further supplied to respective inputs of a logical AND gate 208, whose output is supplied to a delay element 210. The delayed signal is then supplied to the RESET inputs of both the first and second latches 212, 214.

Consequently, when the outputs of both latches 212, 214 are asserted, the output of the AND gate 208 will be asserted as well, thereby resetting both latches 212 and 214 after the delay associated with the delay element 210. The first and second latches 212, 214 are now initialized to repeat the process again for the next cycle. It will be recognized that the output current $i_e$ is either a positive value (being supplied by the first charge pump 202) if the first input signal 201 leads the second input signal 203, or else it is a negative value (being drawn by the second charge pump 205) if the second input signal 203 leads the first input signal 201.

Figure 3A:
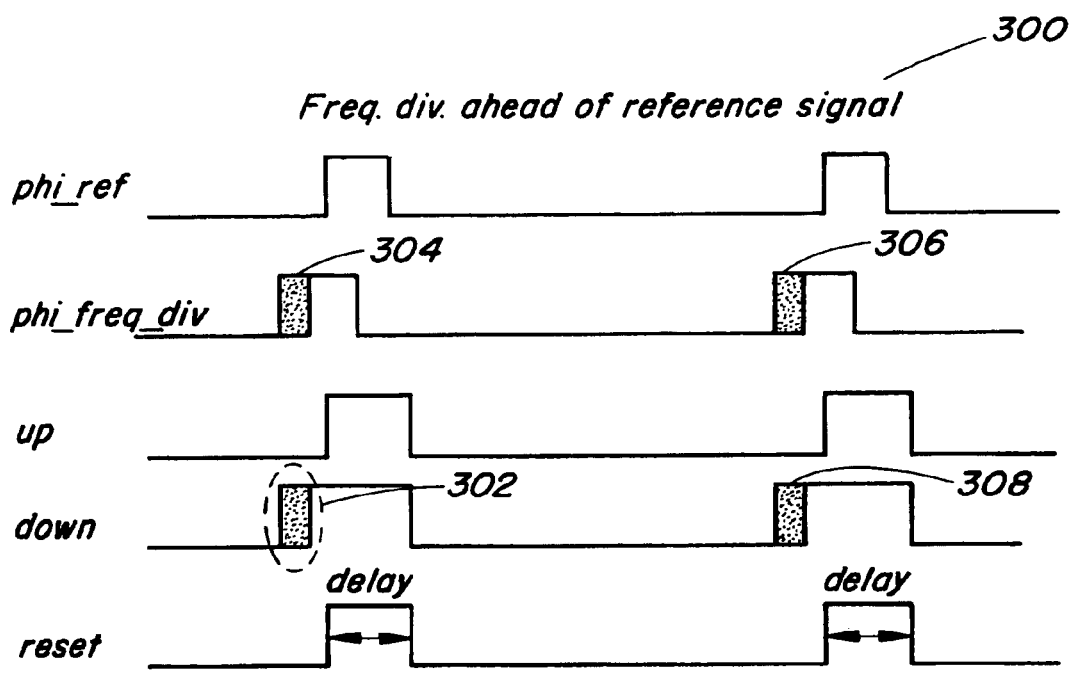
FIG. 3a is a timing diagram showing exemplary internal phase detector signals when the frequency division is ahead of the reference signal.
Figure 3B:
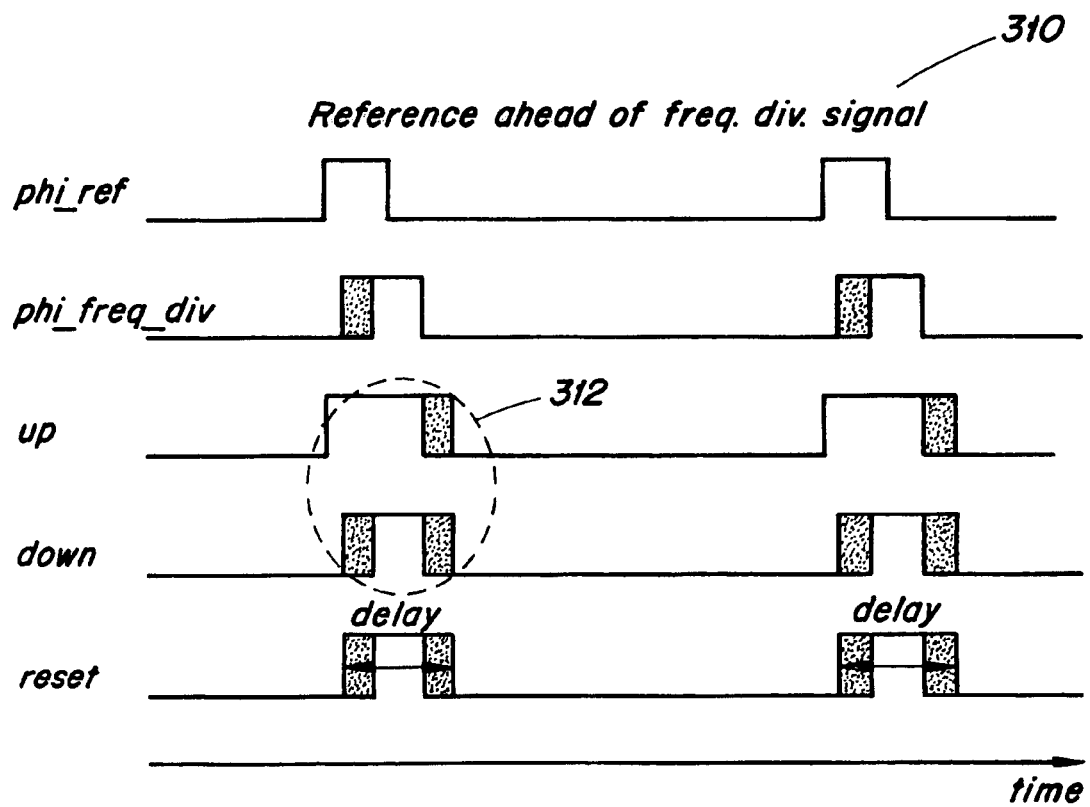
FIG. 3b is a timing diagram showing exemplary internal phase detector signals when the reference is ahead of the frequency division signal.

FIGS. 3a and 3b illustrate two timing diagrams representing two different signal relationship scenarios that can occur within the phase detector of FIG. 2 when the PLL is in a locked steady state mode with modulation applied by the Sigma Delta modulator. The grey zones indicate time varying edges caused by the applied modulation. Modulation is applied by switching the division factor of the PLL. Timing diagram 300 of FIG. 3a illustrates the relative positions of the internal phase detector signals when the frequency divider signal is ahead of the reference signal. In this case, note that only one edge 302 of the "up" and "down" signals is varying in time. The remaining edges of these "up" and "down" signals are stable. The grey zones in both timing diagrams (e.g., zones 302, 304, 306 and 308) indicate respective time varying edges caused by the applied modulation. One exemplary method for achieving the applied modulation is by switching the division factor of the PLL.

In timing diagram 310 of FIG. 3b, the alternative situation of having the reference signal ahead of the frequency division signal is shown. Under these conditions, three edges 312 of the "up" and "down" signals are varying in time. There still remains one stable edge 314, however, associated with the "up" signal.

One implication from having the stable signal edges in the phase detector, is the unwanted sampling of the RF signal leaking back to the phase detector. As mentioned above, this sampling (mixing) process will produce unwanted spurious spectral components at N times the reference frequency at the output of the PLL. It is desirable to at least substantially reduce these spurious spectral components. Another goal is to have the phase/frequency detector be dead band free. This means that the phase detector will be responsive to all phase differences between the reference signal and the frequency divider signal.

Figure 4A:
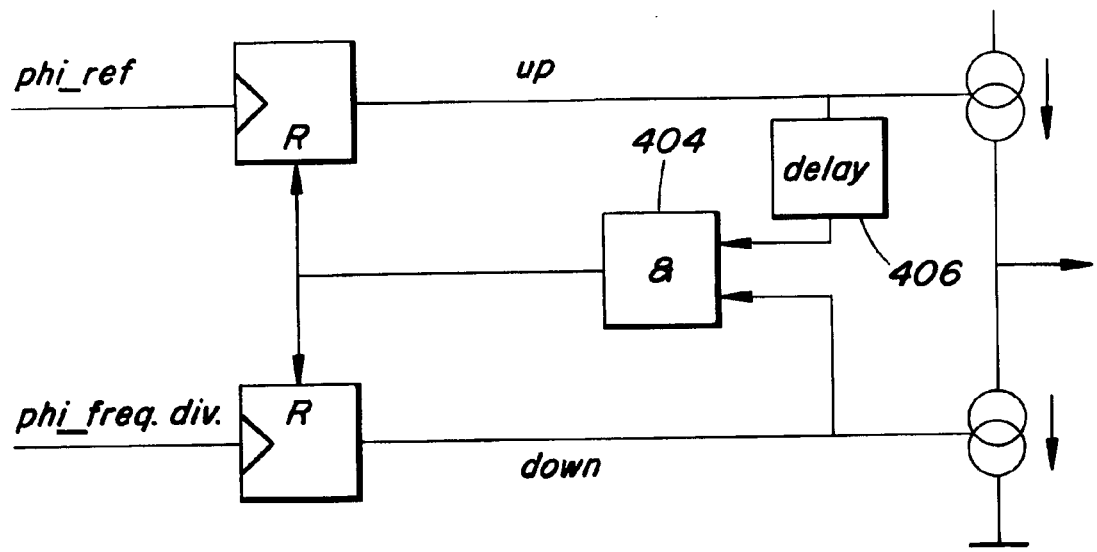
FIGS. 4a and 4b are illustrations of two exemplary typical digital linear dead band free phase/frequency detectors with the delay element located in different locations.
Figure 4B:
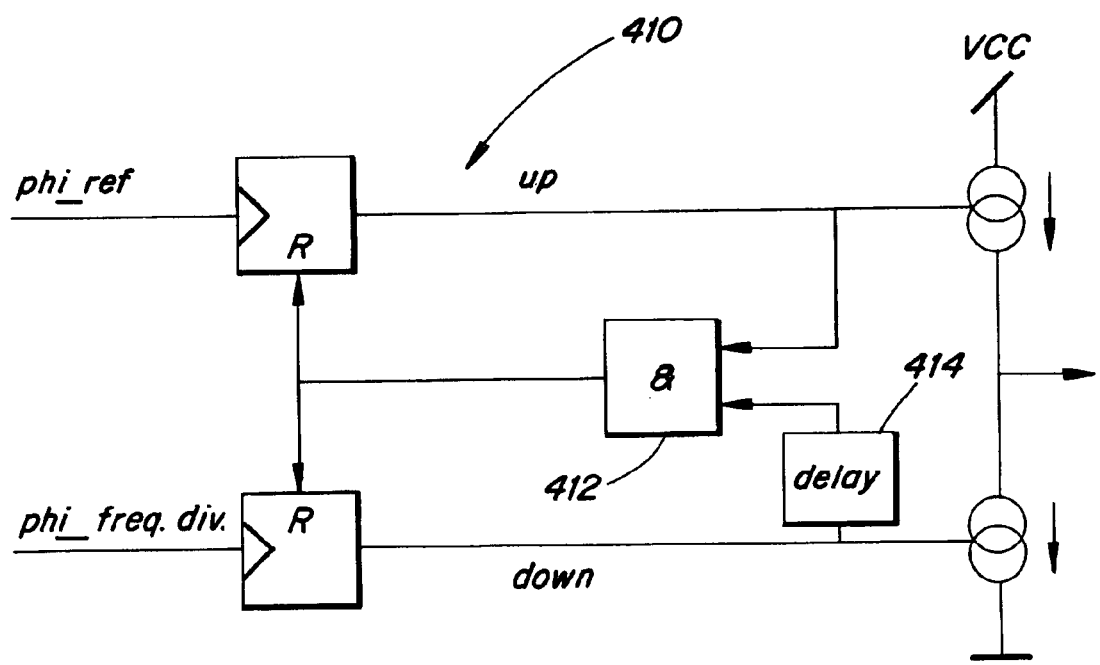

There are different techniques for ensuring that a phase/frequency detector is dead band free. FIGS. 4a and 4b respectively illustrate alternative embodiments 402, 404 of a digital linear dead band free phase/frequency detector. In the phase/frequency detector 402, the delay element 406 is connected to the "up" signal and supplies a delayed "up" signal to the AND gate. Conversely, in the phase/frequency detector 410, the delay element 414 is connected to the "down" signal and supplies a delayed "down" signal to the AND gate. FIGS. 4a and 4b illustrate placing a delay element at either input path of the AND-gate. This results in a phase/frequency detector that is dead-band free and also works in a linear operating mode, since only one of the charge pump pulse lengths varies when modulation is applied.

Figure 5A:
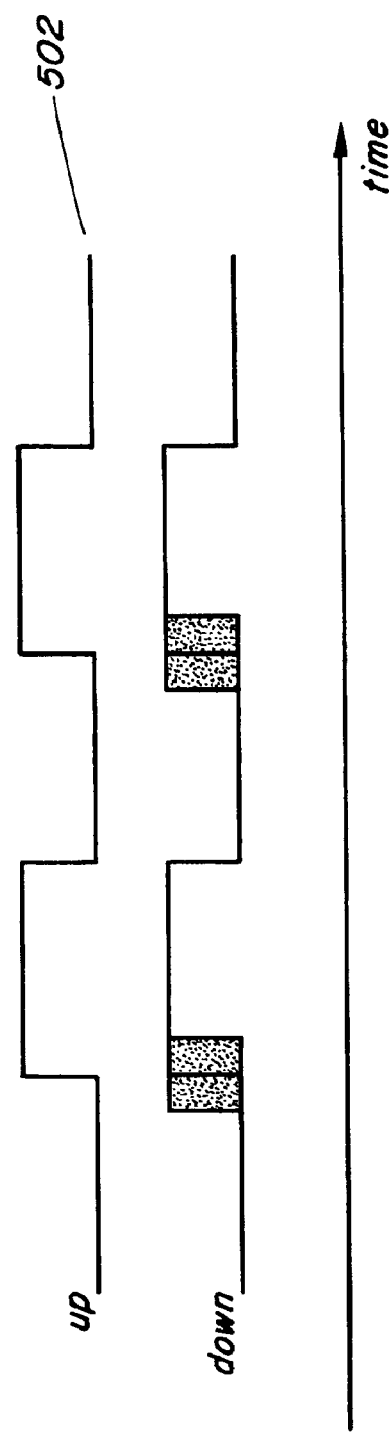
FIGS. 5a and 5b are timing diagrams of exemplary "up" and "down" signals.
Figure 5B:
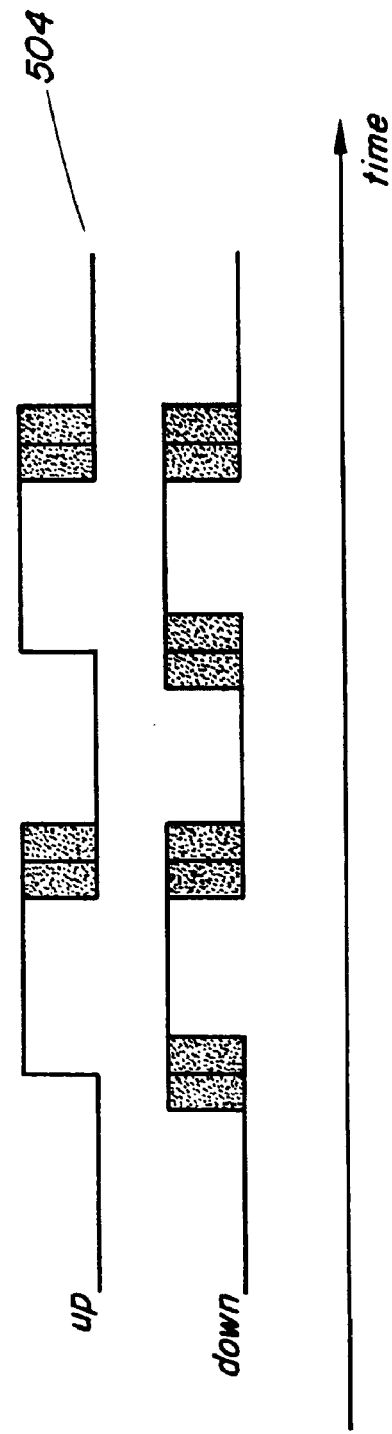

The timing diagrams for these types of phase detectors are shown in FIGS. 5a and 5b. It can be seen that these two types of prior art phase detectors generate "up" and "down" signals that have one or more stable signal edges, causing the unwanted sampling of the leaking RF signal. More specifically, the timing diagram 502 of FIG. 5a corresponds to phase/frequency detector configuration 402 shown in FIG. 4a and timing diagram 504 corresponds to phase/frequency detector configuration 404 shown in FIG. 4b. In timing diagram 502, the "down" signal for the phase/frequency detector configuration 402 is depicted with grey zones representing the respective varying signal edges. The "up" signal for this configuration, however, has both leading and trailing edges that are stable. As shown in configuration timing diagram 504, the "up" signal generated by the phase/frequency detector configuration 404 has a leading edge that is stable. This results in an unwanted sampling of the leaking RF signal.

Figures 6A, 6B:
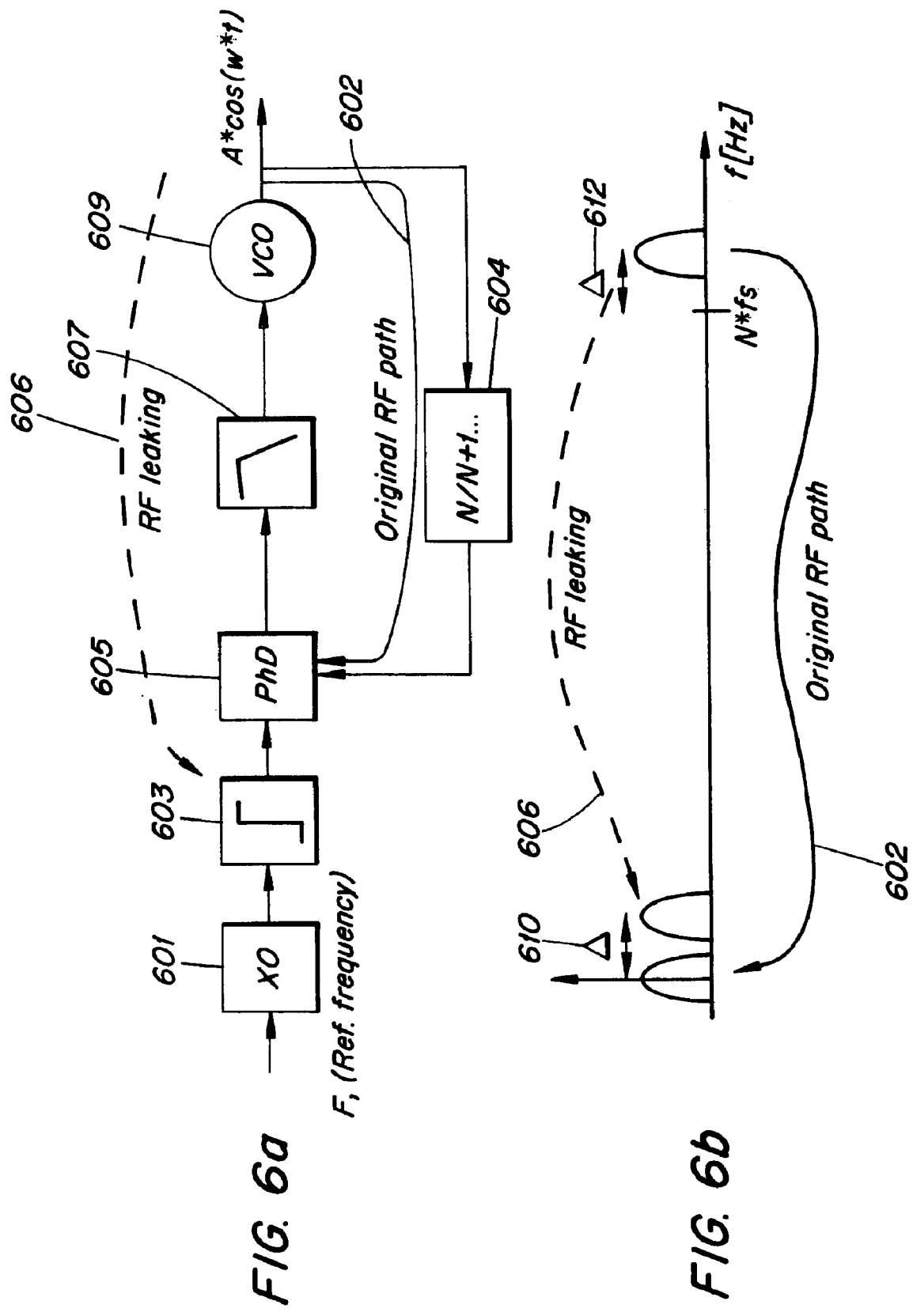
FIG. 6a is a block diagram illustrating an exemplary phase locked loop.
FIG. 6b illustrates the relationship between a leakage path and an original RF path.

One possible source of interference that causes spurious spectral components at N times the reference frequency is an RF signal leaking back to the reference parts of the PLL. FIG. 6a illustrates the different signals present in the PLL and explains the wanted and unwanted signals present in the PLL. In FIG. 6a, the original RF signal 602 is operated on by the average division factor in the frequency divider 604. This operation places the RF signal at the desired location within the base band. The modulation bandwidth (that can be represented by a modulation index) of the original RF signal at baseband is the same as the modulation bandwidth at RF. In other words, the frequency divider 604 only operates on the RF signal by performing a frequency translation. This means that no transformation of modulation index is performed at this point in the process.

The leaking RF path 606, as mentioned earlier, is coupled into the loop at the reference blocks 601 (crystal oscillator), 603 (squares the reference waveform) according to FIG. 6a. The unwanted RF signal at the reference input is mixed (folded/sampled) by the phase detector 605. The output of the phase detector 605 is forwarded to a filter 607 and then forwarded to the voltage controlled oscillator 609. Therefore, the unwanted signal will appear at a position in the base band with an offset equal to that found at RF between the reference multiple and the RF signal as shown in the graph of FIG. 6b.

The total RF spectrum will be the product of the two base band spectrums shown in FIG. 6b. At the PLL output, this results in the wanted spectrum plus spurious spectral components at minus the delta offset 612 and a modulated sideband at plus the delta offset 610, if a modulated spectrum is generated in the Sigma-Delta controlled fractional-N PLL.

An exemplary solution for reducing the impact of signal leakage and signal interference is to make the phase detector act as an imperfect sampler to unwanted interfering signals. One way of doing this is to introduce a time jitter on the remaining stable edges of the "up" and "down" signals. No additional non-linearities are introduced by this technique since all edges of the signals working in the phase detector are intended to be simultaneously time varying.

Figure 7:
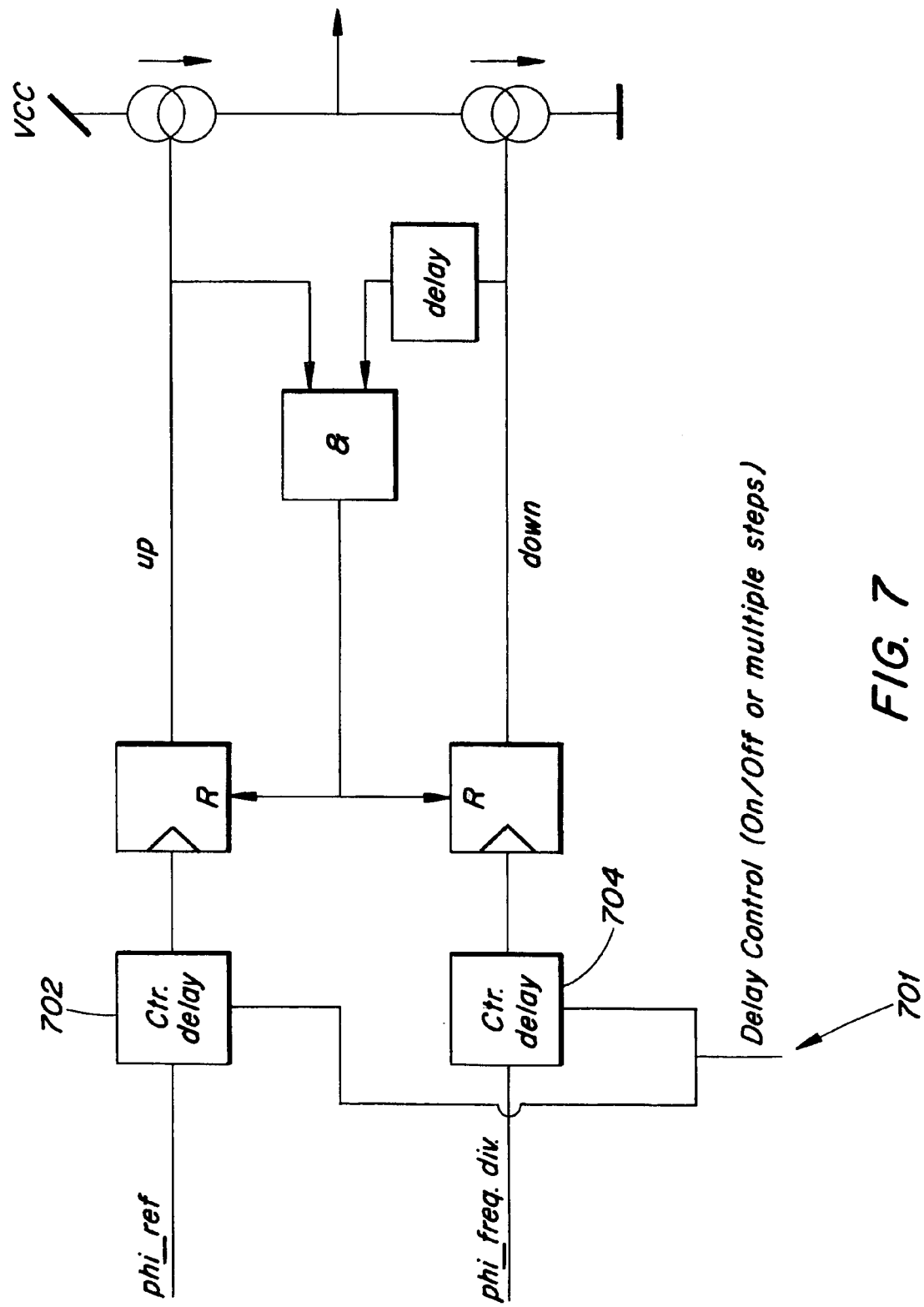
FIG. 7 is a block diagram of an exemplary phase/frequency detector in accordance with the invention.

FIG. 7 illustrates one exemplary embodiment of the present invention. Controllable delay blocks 701, 702 are interposed between the reference signal and the frequency divider signal, respectively. The controllable delay blocks 701, 702 introduce a delay whose amount is controllable. The amount of variability of delay may differ from one embodiment to another. For example, one or both of the controllable delay blocks 701, 702 may introduce either no delay or a fixed delay under the control of a binary signal. In such embodiments, it is preferable although not essential to choose the delay amount such that it is substantially half of the radio frequency (RF) period; that is, to introduce a 180 degree phase shift. As used here, the term "radio frequency" refers to the output frequency of the phase locked loop. This is because the optimum way of degrading the sampling process applied to the interfering signal in the phase detector is to, on average, sample the same amount of in-phase samples as out of phase samples of the interfering signal.

In other alternative embodiments, one or both of the controllable delay blocks 701, 702 may have the capability of introducing any of a larger number of delay possibilities. For example, a 2-bit control signal would be capable of selecting any of four possible delay values.

When the controllable delay blocks 701, 702 are suitably controlled, a time jitter is introduced at the inputs of the phase/frequency detector. This time jitter will propagate through the PLL and also be applied to the signal edges controlling the charge pump. A delay control signal 701 is forwarded to one, both or none of the controllable delay elements 702 or 704. Different types of control signals may be used. The control signal may be a random sequence or a periodic sequence.

In a Sigma-Delta controlled fractional-N PLL, the signal controlling the two input delay blocks shown in FIG. 7, may be taken from one of the Sigma-Delta output signals providing the modulation (i.e., one of the signals that switch the division factor).

Figure 8:
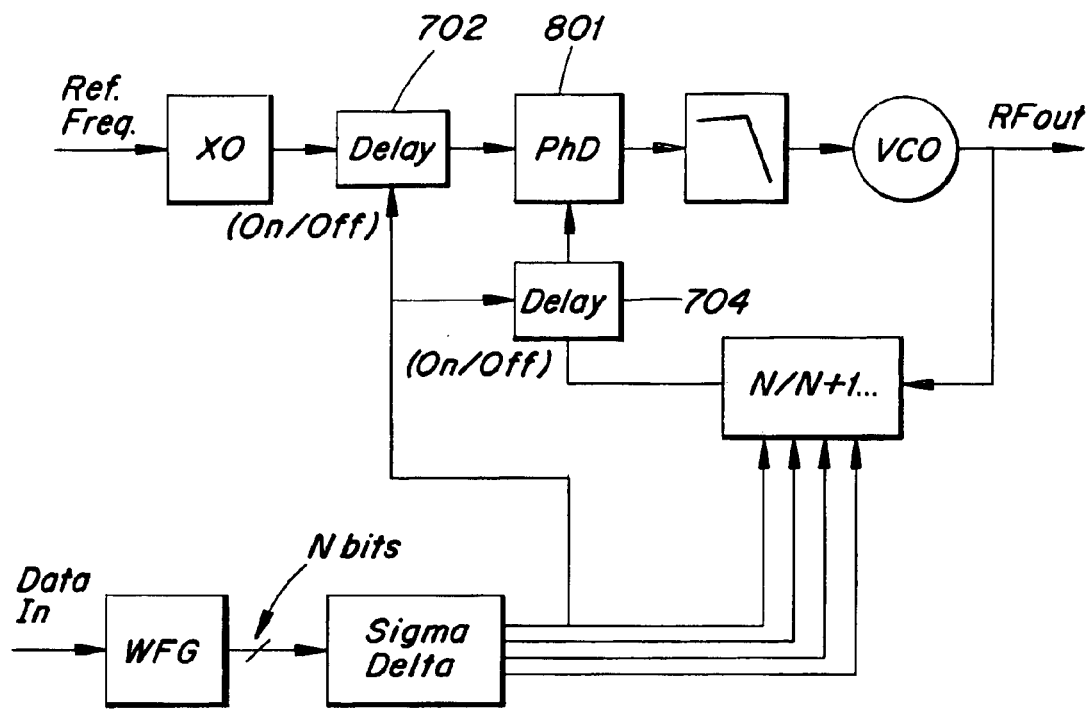
FIG. 8 is a block diagram of an exemplary PLL circuit in accordance with the invention.

Such an arrangement is illustrated in FIG. 8, which shows the controllable delay blocks 702, 704 incorporated into a Sigma-Delta controlled fractional-N PLL. The signal controlling the two controllable delay blocks 702, 704 is taken from one of the Sigma-Delta output signals providing the modulation (i.e., switching the division factor).

Figure 9:
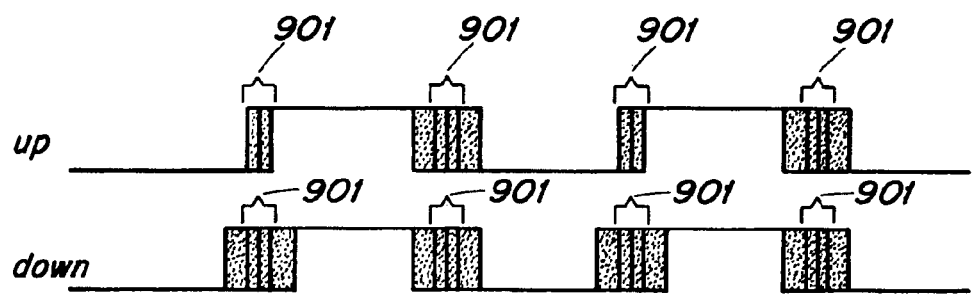
FIG. 9 is an exemplary timing diagram showing the introduction of extra time jitter by the controllable delay element.

FIG. 9 is a timing diagram that shows the introduced extra time jitter 901 caused by the controllable delay elements at the two inputs of the phase detector, assuming that the phase detector 801 is constructed as illustrated in FIG. 4b. Note that all flanks of the "up" and "down" signals are now varying in time. Without this extra jitter, the leading edges of the "up" signal would be stable, as previously illustrated in FIG. 5b. Similar results would be achieved in any of the other previously described phase detector embodiments.

Figure 10:
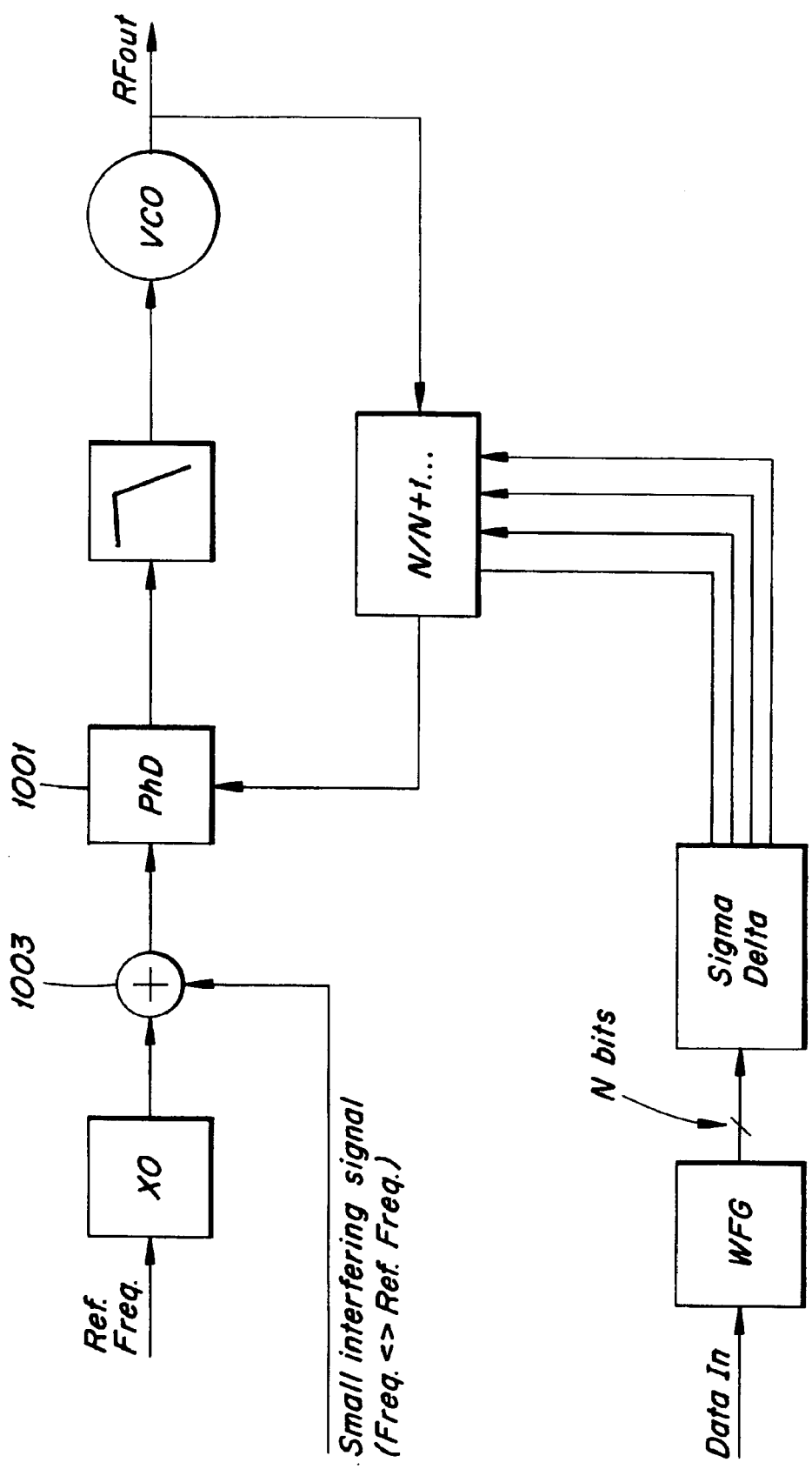
FIG. 10 is a block diagram of another exemplary embodiment showing the addition of a small interfering signal to the reference signal of the PLL.

FIG. 10 illustrates another exemplary embodiment of the present invention. This embodiment reduces the sampling performance of the phase detector by using an interfering signal. More specifically, a small interfering analog signal is introduced that has a frequency differing from the reference frequency of the loop. The interfering signal is applied to those phase detector inputs that are responsible for producing a stable internal phase detector signal. For example, if the phase detector 1001 is constructed like the phase detector 410 shown in FIG. 4b, then the only stable edge is the leading edge of the "up" signal (see FIG. 5b). Consequently, the interfering signal may be applied to the reference input of the phase detector 1001. This may be done by using a combining circuit 1003 to combine the interfering signal with the reference signal and supplying the combined signal to the reference input of the phase detector 1001. If a different phase detector configuration is used, such as the phase detector 402 illustrated in FIG. 4a, then stable edges may also be associated with the "down" signal. (See, e.g., FIG. 5a.) In this case, the interfering signal should be applied to the frequency divider signal input of the phase detector 1001.

The interfering signal will cause the stable internal signal to vary slightly in time at the rate of the interfering signal frequency. The frequency of this interfering signal should be different from the reference frequency. Assuming that the interfering signal is applied to only one of the inputs of the phase detector 1001, a small noise contribution to the overall reference loop noise will be present in the loop, since this solution does not introduce a simultaneous time variation at both inputs of the phase detector 1001.

The invention reduces the problem of having N times the reference frequency spurious spectral components around the RF spectrum when using a sigma delta controlled fractional-N PLL as a modulator or frequency synthesizer. Thus, it is useful for addressing problems associated within an RF signal leaking from the output of the VCO back into the phase detector of a PLL. It is also useful in any PLL that is exposed to unwanted RF interference placed at frequencies close to multiples of the reference frequency.

Furthermore, the illustrated embodiments described above employ charge pumps, and generate an output current that varies as a substantially linear function of the phase difference between two signals. However, alternative embodiments of the invention can also be devised to generate an output voltage rather than an output current, wherein the output voltage varies as a substantially linear function of the phase difference between the two signals. In such cases, voltage generators rather than charge pumps can be employed. The output voltage can serve as the source signal for controlling a VCO in a phase-locked loop, or the output voltage can alternatively be converted to a varying current for those embodiments that utilize a current controlled oscillator instead of a VCO.

Other alternative embodiments of the invention can also be devised. For example, in one embodiment, a controllable delay can be placed at the two signal inputs of a digital frequency/phase detector. This particular embodiment can jitter all internal signal flanks within the frequency/phase detector. In another embodiment, the controllable delay may be implemented in binary form as "delay on/off", or as a controllable delay containing a complete set of different delays. Another way of controlling the delay may be by using a digital pseudo random bit-stream which is binary for a two level delay setting or alternatively M-ary for a multilevel delay setting. In yet another alternative, the controllable delay may be controlled by a periodic analog signal, or by a periodic digital (binary or M-ary) sequence, depending on the number of delay levels implemented. Any of the foregoing embodiments can be used in combination with the use of only one controllable delay at either one of the phase detector inputs. In still another alternative, a third analog "interferer" signal having a different frequency from that of the reference frequency of the loop can be applied to the phase detector input responsible for producing a stable internal signal flank. Further, any combination of the aforementioned embodiments can be used as a phase detector implementation in a Sigma Delta controlled fractional-N PLL or used as a phase detector implementation in any PLL which is exposed to an interfering RF signal placed close to frequencies that are multiples of the reference frequency of the PLL. Thus, the above-described embodiments are merely illustrative and should not be considered restrictive in any way. The scope of the invention is given by the appended claims, rather than the preceding description, and all variations and equivalents which fall within the range of the claims are intended to be embraced therein.

What is claimed is:

1. A phase locked loop, comprising:
    a voltage controlled oscillator;
    a phase detector; and
    logic that degrades the sampling performance of the phase detector.

2. The phase locked loop of claim 1, wherein the logic that degrades the sampling performance of the phase detector comprises:
    logic that introduces a time varying delay at one or more inputs of the phase detector.

3. The phase locked loop of claim 1, wherein the logic that degrades the sampling performance of the phase detector comprises:
    logic that applies an interfering analog signal to an input of the phase detector, wherein the input is associated with a stable internal phase detector signal.

4. The phase locked loop of claim 1, wherein the phase detector includes at least two signal inputs, and wherein the logic that degrades the sampling performance of the phase detector comprises:
    a controllable delay that supplies a delayed signal to one of the phase detector signal inputs.

5. The phase locked loop of claim 4, wherein the logic that degrades the sampling performance of the phase detector further comprises:
    an additional controllable delay that supplies an additional delayed signal to a different one of the phase detector signal inputs.

6. The phase locked loop of claim 4, wherein the logic that degrades the sampling performance of the phase detector includes logic that generates a control signal that causes the controllable delay to jitter at least one of the internal signal edges within the phase detector.

7. The phase locked loop of claim 4, wherein the controllable delay selectively applies one of two delays to an input signal based on a control signal.

8. The phase locked loop of claim 7, wherein the two delays are NO delay and a predefined non-zero delay.

9. The phase locked loop of claim 8, wherein the predefined non-zero delay is equal to half of a period of an interfering signal being applied to said one of the phase detector signal inputs.

10. The phase locked loop of claim 4, wherein the controllable delay comprises delay logic that selectively applies one of a plurality of different delay times to said one of the phase detector signal inputs.

11. The phase locked loop of claim 4, wherein the controllable delay is controlled by a digital pseudo random bitstream.

12. The phase locked loop of claim 11, wherein each bit of the digital pseudo random bitstream selects one of two or more delay settings.

13. The phase locked loop of claim 4, wherein the controllable delay is controlled by an M-ary digital pseudo random bitstream.

14. The phase locked loop of claim 4, wherein the controllable delay is controlled by a periodic analog signal.

15. A Sigma Delta controlled fractional-N phase locked loop comprising the phase locked loop of claim 1.

16. A method of generating an oscillating signal comprising:

receiving a reference frequency signal;

detecting a phase or frequency difference between the reference frequency signal and a feedback signal and generating a difference signal representative of the phase or frequency difference;

generating an oscillating signal as a function of the difference signal;

generating the feedback signal as a function of the oscillating signal; and degrading the sampling performance of the detecting step.

17. The method of claim 16, wherein degrading the sampling performance of the detecting step comprises introducing a time varying delay to at least one of the reference frequency signal and the feedback signal prior to performing the detecting step.

18. The method of claim 17, further comprising using a digital pseudo random bitstream to determine the time varying delay.

19. The method of claim 18, wherein the digital pseudo random bitstream controls two or more delay settings.

20. The method of claim 18, wherein the digital pseudo random bitstream is an M-ary digital pseudo random bitstream.

21. The method of claim 17, wherein the time varying delay varies between two delay values.

22. The method of claim 21, wherein the two delay values are NO delay and a predefined non-zero delay.

23. The method of claim 22, wherein the predefined non-zero delay is equal to half of a period of the oscillating signal.

24. The method of claim 17, further comprising using a periodic analog signal to determine the time varying delay.

25. The method of claim 16, wherein degrading the sampling performance of the detecting step comprises applying an interfering analog signal to at least one of the reference frequency signal and the feedback signal prior to performing the detecting step.

26. The method of claim 16, wherein degrading the sampling performance of the detecting step comprises introducing a time varying delay to both the reference frequency signal and the feedback signal prior to performing the detecting step.

* * * * *

UNITED STATES PATENT AND TRADEMARK OFFICE
CERTIFICATE OF CORRECTION

| | | |
|---|---|---|
| PATENT NO. | : 6,952,138 B2 | Page 1 of 1 |
| DATED | : October 4, 2005 | |
| INVENTOR(S) | : Hans Hagberg and Magnus Nilsson | |

It is certified that error appears in the above-identified patent and that said Letters Patent is hereby corrected as shown below:

Column 5,
Lines 28, 49 and 56, change "404" to -- 410 --.

Column 6,
Lines 34, 38, 41, 53 and 57, change "701" to -- 704 --.

Signed and Sealed this

Second Day of May, 2006

JON W. DUDAS
*Director of the United States Patent and Trademark Office*